(12) United States Patent
Park et al.

(10) Patent No.: US 7,052,801 B2
(45) Date of Patent: May 30, 2006

(54) ANODE THIN FILM FOR LITHIUM SECONDARY BATTERY AND PREPARATION METHOD THEREOF

(75) Inventors: Young-sin Park, Kyungki-do (KR); Joo-yeal Oh, Seoul (KR); Sung-man Lee, Kangwon-do (KR); Hong-koo Baik, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 530 days.

(21) Appl. No.: 10/041,621

(22) Filed: Jan. 10, 2002

(65) Prior Publication Data

US 2003/0044682 A1 Mar. 6, 2003

(30) Foreign Application Priority Data

Aug. 28, 2001 (KR) ......................... 2001-52111

(51) Int. Cl.
*H01M 4/38* (2006.01)
*H01M 4/04* (2006.01)

(52) U.S. Cl. .................. 429/223; 429/162; 29/623.5
(58) Field of Classification Search ............. 429/162, 429/223; 29/623.1, 623.5; 204/192.11, 192.17
See application file for complete search history.

(56) References Cited

U.S. PATENT DOCUMENTS

| 4,094,761 | A |   | 6/1978  | Wilson |
| 5,618,640 | A |   | 4/1997  | Idota et al. |
| 6,033,537 | A |   | 3/2000  | Suguro |
| 6,203,944 | B1 |  | 3/2001  | Turner et al. |
| 6,265,111 | B1 | * | 7/2001 | Bito et al. ............. 429/231.95 |
| 6,602,354 | B1 | * | 8/2003 | Kanematsu et al. .......... 148/20 |

FOREIGN PATENT DOCUMENTS

| EP | 1 043 789 A1 | 10/2000 |
| EP | 1 122 802 A1 | 8/2001 |
| JP | 60124357 | 7/1985 |
| JP | 4-308081 | * 10/1992 |
| JP | 9180703 | 7/1997 |
| JP | 11-86854 | * 3/1999 |
| JP | 11086854 | 3/1999 |
| JP | 2001-256967 | * 9/2001 |
| JP | 2001-256968 | 9/2001 |
| WO | 01/48840 A1 | 7/2001 |

OTHER PUBLICATIONS

Yoshio Idota, et al., "Tin–Based Amorphous Oxide: A High Capacity Lithium–Ion Storage Material", Science, 276 (1997) 1395–1397.

Mao et al., "Mechanically Alloyed Sn–Fe(–C) Powders as Anode Materials for Li–Ion Batteries", J. Electrochem. Soc., 146(2) (1999) 405–413.

Beaulieu et al., "The Reaction of Lithium with Sn–Mn–C Intermetallics Prepared by mechanical Alloying", J. Electrochem. Soc., 147 (9) (2000) 3237–3241.

Kepler et al., "$Li_xCu_6Sn_5$ (0<x<13): An Intermetallic Insertion Electrode for Rechargeable Lithium Batteries", Electrochem. Solid–State Lett., 2 (7) (1999) 307–309.

Yang et al., "Sub–Microcrystalline Sn and Sn–SnSb Powders as Lithium Storage Materials for Lithium Ion Batteries", Electrochem. Solid–State Lett., 2 (4) (1999) 161–163.

Yang et al. "Ultrafine Sn and $SNSb_{0.14}$ Powders for Lithium Storage Materials in Lithium–Ion Batteries", J. Electrochem. Soc., 146 (11) (1999) 4009–4013.

European Search Report issued by the European Patent Office on Feb. 1, 2005 in a corresponding application (publication EP 1289033, Mar. 5, 2003).

* cited by examiner

*Primary Examiner*—Jonathan Crepeau
(74) *Attorney, Agent, or Firm*—Burns, Doane, Swecker & Mathis, L.L.P.

(57) ABSTRACT

An anode thin film for a lithium secondary battery having a current collector and an anode active material layer formed thereon, wherein the anode active material layer contains an intermetallic compound of tin (Sn) and nickel (Ni). In particular, the intermetallic compound is $Ni_3Sn_4$.

9 Claims, 5 Drawing Sheets

ANODE THIN FILM FOR LITHIUM SECONDARY BATTERY AND PREPARATION METHOD THEREOF

Priority is claimed to Patent Application Number 2001-52111, filed in the Republic of Korea on Aug. 28, 2001, herein incorporated by reference.

BACKGROUND OF THE INVENTION

1. Field of the Invention

The present invention relates to an anode thin film for lithium secondary battery and a preparation method thereof, and more particularly, to an anode thin film for a lithium secondary battery having a reduced initial irreversible capacity by using an intermetallic compound of tin (Sn) and nickel (Ni) as a material of forming an anode active material layer formed on a current collector, and having improved charging/discharging cycle characteristics by solving the problem of aggregation of tin due to intercalation/deintercalation of lithium.

2. Description of the Related Art

It is known that metallic lithium in an organic electrolyte is thermodynamically unstable and is coated with a thin surface layer called a solid electrolyte interface (SEI). The unstable property of the metallic lithium used as an anode-forming material may result in dendrite growth during repeated cycles of charging and discharging, leading to deterioration in stability of battery.

A lithium ion battery can secure its stability and can maintain high capacitance characteristics by employing graphite as an anode-forming material. A graphite anode reversibly enables storage and separation of lithium through intercalation of lithium ions. Since the inserted lithium ions are not in the form of metal, factors that may adversely affect the stability of a battery, for example, growth of dendrite, can be prevented.

However, graphite anodes have only approximately 10% of an energy density of metallic lithium anodes. Various anode materials including disordered carbon, nitrides or oxides, which exhibit improved capacity compared to graphite, have been proposed for overcoming the problem of small energy density.

Various studies Oxide-based anodes exemplified by tin oxides were proposed for the first time by Fuji Photo Film Co., Ltd., in U.S. Pat. No. 5,618,640 by Y. Idota et al, and in a paper by Idota et al. entitled "Tin-Based Amorphous Oxide: A High Capacity Lithium-Ion Storage Material", Science, 276 (1997) 1395–1397, and have approximately twice a charge/discharge capacity of graphite-based anodes and are excellent in potential characteristics compared with existing substitutes.

Oxide-based anodes consist of oxides of metal that can form lithium alloys, such as tin oxide ($SnO$ or $SnO_2$), lead oxide (PbO) or silicon oxide (SiO). These oxide-based anode-forming materials serve as precursors of anode active materials. Thus, as lithium ions are diffused across the lattice of metal, oxygen ion and metal ion are separated from each other. Also, as intercalated lithium ions react with oxygen ions, separation occurs in the lattice of metal. Active materials capable of charging/discharging are substantially metals separated in the above-described manner, rather than metal oxides.

It is also known that lithium can be stored/removed by an alloying reaction between tin and lithium.

The oxide-based anodes consisting of oxides, e.g., tin oxide, have good cycle characteristics, compared with lithium alloys, in the following reasons.

First, as lithium ions are diffused across the lattice of metal, a metal that can form lithium alloys, e.g., tin, is separated. However, the separated metal is very small in size, the mechanical loss of an active material, due to a change in volume, can be minimized.

Second, since, during initial stage of lithium storage, lithium oxide ($Li_2O$), which is a product based on the reaction between the lithium produced simultaneously with separated metal during initial storage of lithium, and the oxygen ions, is evenly dispersed, damage of the active material due to a change in volume can be suppressed.

However, the oxide-based anode exhibits a relatively high initial irreversible capacity due to formation of lithium oxide, which is necessarily generated during the first charging/discharging cycle. Accordingly, an excess amount of a cathode active material is required, which is impediment to practical use.

In order to reduce the initial irreversible capacity while maintaining high capacity and good cycle characteristics of an oxide-based anode, there have been proposed methods in which an intermetallic compound or nano-sized metal powder is employed. The methods in which an intermetallic compound is employed are disclosed in U.S. Pat. No. 6,203,944 by Robert L. Turner et al, entitled "Electrode for a lithium battery," papers entitled "Mechanically Alloyed Sn—Fe(—C) Powders as Anode Materials for Li-Ion Batteries," by Mao et al., J. Electrochem. Soc., 146 (2) (1999) 405–413, "The Reaction of Lithium with Sn—Mn—C Intermetallics Prepared by Mechanical Alloying," by Beaulieu et al, J. Electrochem. Soc., 147 (9) (2000) 3237–3241, and "$Li_xCu_6Sn_5$ (0<x<13): An Intermetallic Insertion Electrode for Rechargeable Lithium Batteries," by Kepler et al., Electrochem. Solid-State Left., 2 (7) (1999) 307–309. The methods in which nano-sized metal powder is employed are disclosed in papers entitled "Sub-Microcrystalline Sn and Sn—SnSb powders as Lithium Storage Materials for Lithium Ion Batteries," by Yang et al., Electrochem. Solid-State Lett., 2 (4) (1999) 161–163, and "Ultrafine Sn and $SnS_{0.14}$ Powders for Lithium Storage Materials in Lithium-Ion Batteries," by Yang et al., J. Electrochem. Soc., 146 (11) (1999) 4009–4013.

The former methods will now be described in more detail. A tin-based intermetallic compound, for example, $Sn_2Fe$ or $Cu_6Sn_5$, consists of an intermetallic compound of a metal which does not form a lithium alloy and a metal which is reactive with lithium. Also, since the tin-based intermetallic compound does not undergo irreversible reaction, e.g., formation of lithium oxide ($Li_2O$) due to diffusion of lithium ions into the lattice of metal, unlike tin oxide, initial irreversible capacity can be reduced.

However, the tin-based intermetallic compound causes aggregation of tin due to repeated intercalation/deintercalation of lithium ions, which aggravates the mechanical damage of an active material depending on a change in volume, like metallic tin, resulting in considerable deterioration of cycle characteristics.

To solve the above-described problems, an attempt to use a composite material of an active-phase material enabling intercalation/deintercalation of lithium and an inactive-phase material non-reactive with lithium, prepared by a mechanical alloying method, as an anode forming material, has been made.

Detailed examples of the composite material include a composite material consisting of $Sn_2Fe$ as an active-phase material and $SnFe_3C$ as an inactive-phase material. While such a composite material has a fine structure, improved cycle characteristics due to addition of inactive-phase material, and an increased energy density per volume, its energy density per weight is very small, i.e., less than 200 mAh/g.

As shown in FIG. 1, a lithium-tin alloy ($Li_{4.4}Sn$) has a relatively low operating voltage with respect to a lithium electrode, i.e., 0.7 V or less, and has an energy density per unit weight of approximately 790 mAh/g, which is higher than that of a lithium-graphite compound ($LiC_6$) having an energy density of 342 mAh/g.

In the lithium-tin alloy enabling intercalation/deintercalation of lithium, aggregation of tin, which is due to intercalation/deintercalation of lithium, and a severe change in volume, cause cracks on the surface of and within tin, which leads to electrical disconnection with a current collector, thereby deteriorating cycle characteristics, which is confirmed in FIG. 2.

Referring to FIG. 2, when an anode of lithium-tin alloy film is charged/discharged with a constant current of 50 $\mu A/cm^2$ up to 0 to 1.2 V, the initial charge capacity thereof began to sharply decrease after repetition of 5 cycles until it vanishes after repetition of 20 cycles, that is, the cycle life is deteriorated.

SUMMARY OF THE INVENTION

To solve the above-described problems, it is a first object of the present invention to provide an anode thin film for a lithium secondary battery, which can solve the problem of aggregation of tin due to intercalation/deintercalation of lithium.

It is a second object of the present invention to provide a manufacturing method of the anode thin film.

It is a third object of the present invention to provide a lithium secondary battery having improved charging/discharging characteristics by employing the anode thin film.

To accomplish the above and other objects, an anode thin film for a lithium secondary battery according to an embodiment of the present invention includes a current collector and an anode active material layer formed thereon, wherein the anode active material layer contains an intermetallic compound of tin (Sn) and nickel (Ni). In particular, the intermetallic compound is preferably $Ni_3Sn_4$.

According to another aspect of the present invention, a method of preparing an anode thin film for a lithium secondary battery includes mosaic-sputtering tin (Sn) and metallic nickel (Ni), co-sputtering tin (Sn) and metallic nickel (Ni) and sputtering single target or target containing tin (Sn) and metallic nickel (Ni).

According to another aspect of the present invention, a method of preparing an anode thin film for a lithium secondary battery includes the steps of forming an intermetallic compound evaporation source of tin (Sn) and metallic nickel (Ni) by a mechanical alloying method and depositing the intermetallic compound evaporation source by at least selected from the group consisting of e-beam evaporation and ion beam assisted deposition (IBAD).

According to yet another aspect of the present invention, a lithium secondary battery employs the anode thin film. The lithium secondary battery is preferably a lithium thin film battery.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
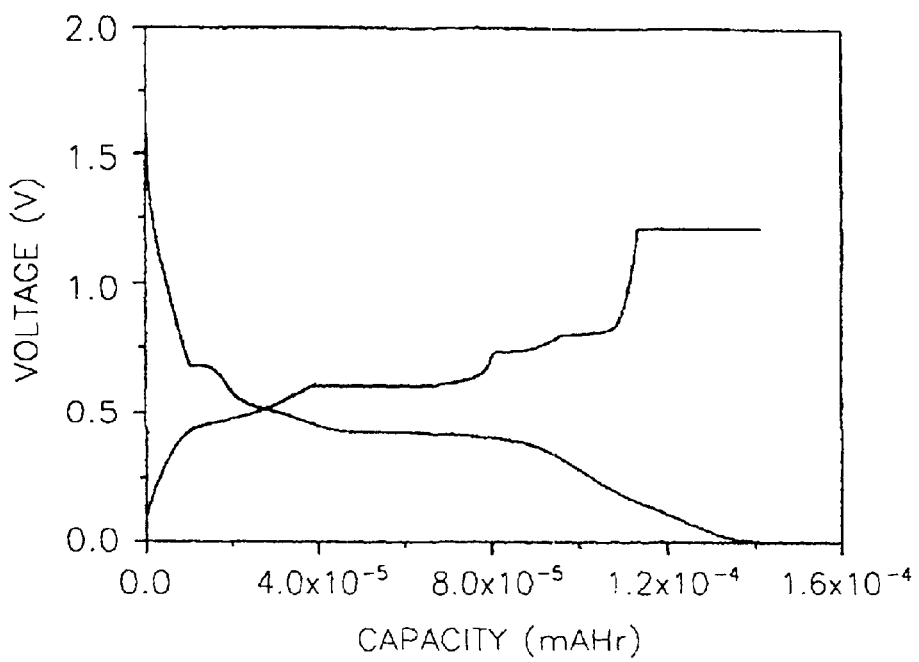
FIG. 1 is a charging/discharging cycle voltage curve of a conventional lithium-tin alloy.
Figure 2:
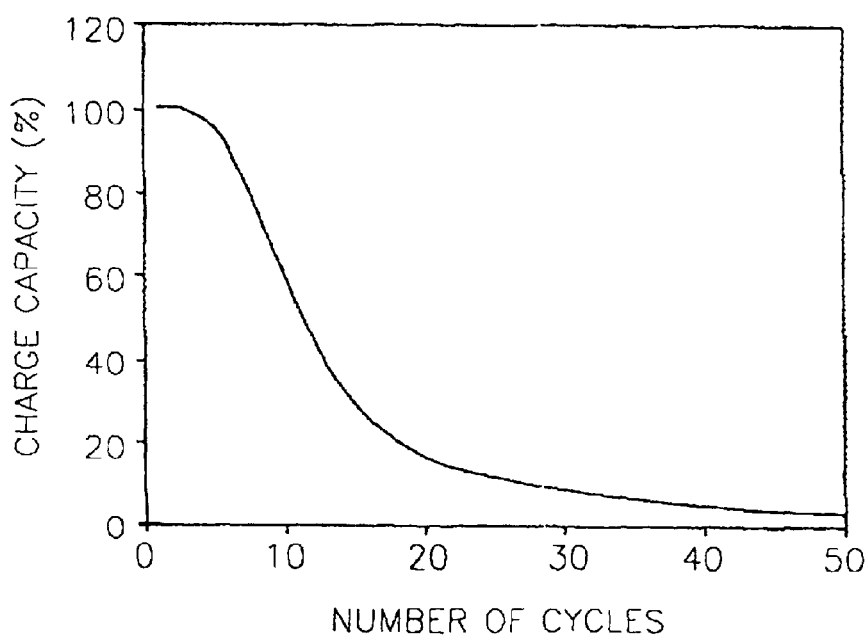
FIG. 2 is a graph showing the cycle characteristic of the conventional anode of a lithium-tin alloy film.

The present invention is directed to improvement in cycle characteristics by employing an intermetallic compound of tin (Sn) and nickel (Ni) in order to solve an inherent problem of tin, that is, in order to suppress a stress due to volumetric expansion of tin, thereby improving the structural stability to improve cycle characteristics.

Unlike the conventional lithium-tin alloy, the intermetallic compound of tin (Sn) and a nickel (Ni) metal, that is, $Ni_3Sn_4$, the tin (Sn) being an active material of reaction with lithium (Li) and the nickel (Ni) metal not reacting with Li, does not undergo a reaction of forming a compound with Li ions diffused into a grid with oxygen ions contained in oxide, thereby almost removing the initial irreversible capacity.

Methods of forming the tin-nickel alloy film are not specifically restricted but the following methods are used in the present invention by way of examples.

First, tin and nickel are simultaneously deposited by a co-sputtering method.

According to this method, a tin target and a nickel target are separately prepared and co-sputtered for deposition. In such a manner, a single intermetallic compound layer of tin-nickel is formed by the co-sputtering method. The contents of tin and metallic nickel within the single layer can be adjusted by controlling the power of energy sources applied to the tin target and nickel target to be in a predetermined range.

Second, tin and metallic nickel are mosaic-sputtered. According to this method, a tin target and a metallic nickel chips are symmetrically arranged to be sputtered. Here, the composition of tin and nickel can be adjusted by controlling the number of nickel chips.

Third, a tin-nickel alloy target is first prepared and then sputtered. Here, the composition of the intermetallic compound thin film of tin and nickel can be adjusted by differing the mixture ratio of tin and metallic nickel in the tin-nickel alloy target.

Fourth, e-beam evaporation and/or ion beam assisted deposition (IBAD) may be used.

Tin and metallic nickel powder are first alloyed by a mechanical alloying method to prepare a corresponding evaporation source of a tin-nickel intermetallic compound.

Thereafter, the evaporation source is deposited by the e-beam evaporation and/or ion beam assisted deposition (IBAD) to prepare a tin-nickel intermetallic compound thin film. Here, accelerated Ar ions are applied to the evaporation source to increase the mobility of metal ions or to change the surface state of the tin-metal film. Also, the composition of the intermetallic compound film of tin-metal can be changed by adjusting the flux of e-beam electrons, and the crystallinity and fine structure of the intermetallic compound film can be adjusted by changing the flux and accelerated voltage of Ar ions.

$Ni_3Sn_4$ is preferably used as the intermetallic compound of tin and metal in view of structural stability. Unlike conventional lithium-tin alloy, the intermetallic compound of tin and nickel, i.e., $Ni_3Sn_4$, the tin being an active material of reaction with lithium, and the nickel not reacting with lithium, does not undergo a reaction of forming a compound reacting with lithium ions diffused into the lattice of metal with oxygen ions so that the initial irreversible capacity is almost removed.

The method of preparing a thin film using the tin-nickel intermetallic compound $Ni_3Sn_4$ will now be described.

First, a $Ni_3Sn_4$ evaporation source is prepared by mechanically alloying tin and nickel, which will now be explained in more detail.

Tin and nickel are mixed in a predetermined molar ratio, pulverized into particles having a predetermined diameter and then heat treated, thereby obtaining the $Ni_3Sn_4$ evaporation source. Here, the temperature of heat treatment is closely related to $Ni_3Sn_4$ crystalinity, and is preferably in the range of 300 to 550° C. If the heat treatment temperature is less than 300° C., the $Ni_3Sn_4$ crystalinity is so weak as not to maintain a $Ni_3Sn_4$ crystal structure during charging/discharging cycles, leading to deterioration of cycle characteristics. If the heat treatment temperature is greater than 550° C., grains increase in size during heat treatment, so that grain boundary fraction which act as a host of lithium intercalation/deintercalation is reduced to thus exhibit a decrease in capacity of $Ni_3Sn_4$.

Thereafter, the evaporation source is subjected to e-beam evaporation and/or ion-beam assisted deposition (IBAD) to prepare a tin-nickel intermetallic compound ($Ni_3Sn_4$) film.

Figure 3:
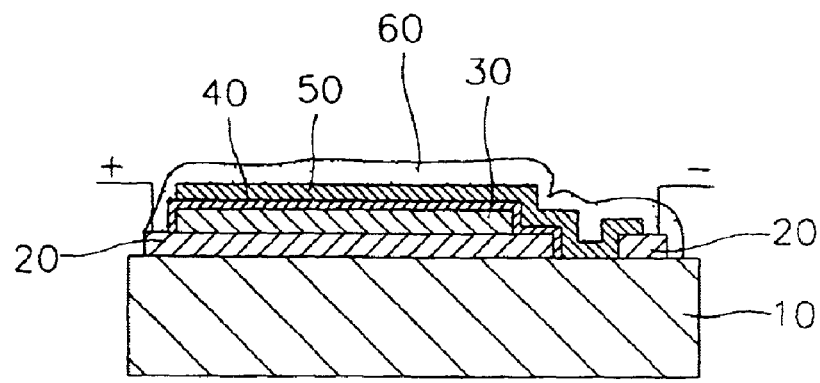
FIG. 3 is a cross-sectional view of a lithium thin film battery employing an anode thin film according to the present invention.

FIG. 3 is a cross-sectional view of a lithium thin film battery employing an anode thin film according to the present invention. Referring to FIG. 3, a thin film battery is basically constructed such that a current collector 20 made of platinum is arranged on a substrate 10, an anode 30, an electrolyte 40 and a cathode 50, each being in the form of a film, are sequentially stacked on the current collector 20. A protective film 60 for protecting the thin film battery by shielding the same from outside, is deposited on the cathode 50.

In the thin film battery having the aforementioned configuration, the cathode 50 contains lithium composite oxide such as lithium cobalt oxide ($LiCoO_2$), lithium manganese oxide ($LiMn_2O_4$) or lithium nickel oxide ($LiNiO_2$). The electrolyte 40 consists of Lipon, which is a lithium ion conductive material. The protective film 60 is made of parylene. Here, Lipon represents lithium phosphorus oxynitride.

The present invention will now be described in more detail through the following examples, but not limited thereto.

EXAMPLE 1

Tin (Sn) and nickel (Ni) powder were mixed in a molar ratio of 4:3 to prepare a tin-nickel intermetallic compound ($Ni_3Sn_4$) by the following mechanical alloying method.

Figure 4:
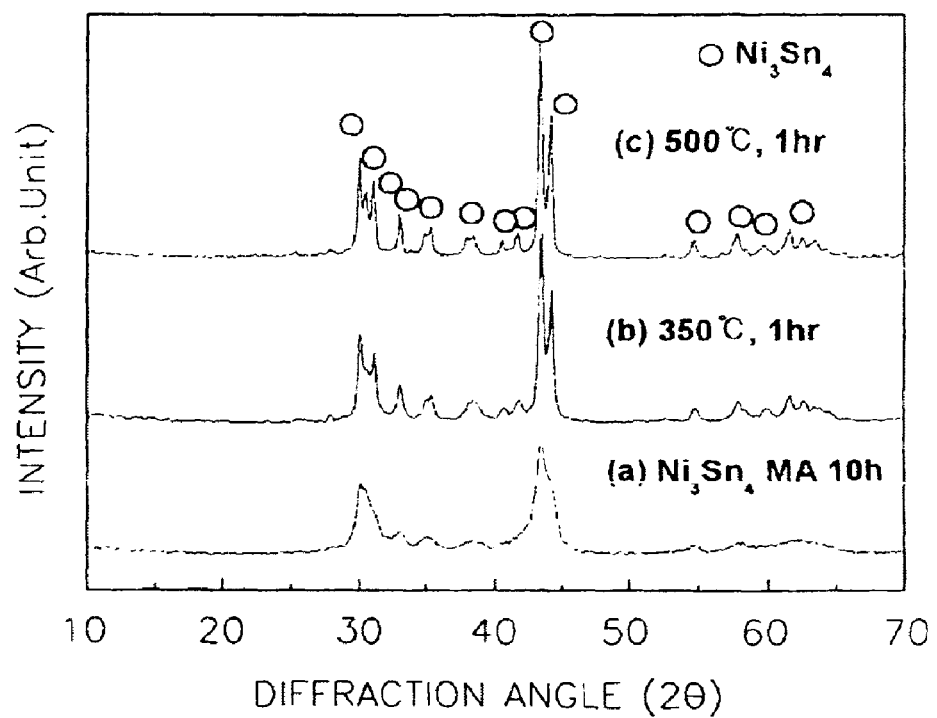
FIG. 4 represents an X-ray diffraction analysis of $Ni_3Sn_4$ prepared by Example 1 of the present invention.

That is to say, after tin (Sn) and nickel (Ni) powders were weighed in a molar ratio of 4:3, tin (Sn) and nickel (Ni) were mixed sufficiently using an agate mortar and ball-milled at approximately 750 rpm using an oscillation-type ball mill for approximately 10 hours. After ball-milling, the resultant was thermally treated at 350° C. and 500° C. for approximately 1 hour to prepare a tin-nickel intermetallic compound ($Ni_3Sn_4$). The X-ray diffraction analysis result of the prepared tin-nickel intermetallic compound ($Ni_3Sn_4$) is shown in FIG. 4. Referring to FIG. 4A, it was confirmed that only $Ni_3Sn_4$ was prepared by a mechanical alloying method without tin and nickel as starting materials when a mixture of tin and nickel powder were mechanically milled for approximately 10 hours. As shown in FIGS. 4B and 4C, the $Ni_3Sn_4$ crystalinity increased as the heat treatment temperature increased to 350° C. and 500° C.

Figure 5:
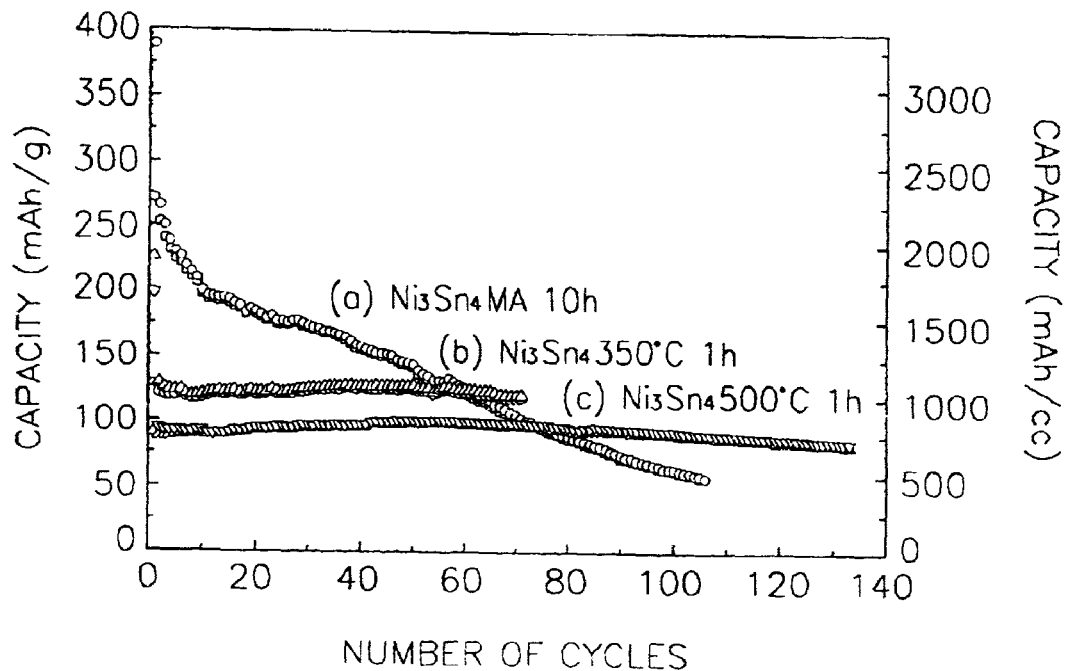
FIG. 5 represents charging/discharging cycle characteristics of a lithium secondary battery employing $Ni_3Sn_4$ prepared by Example 1 of the present invention.

In order to evaluate electrochemical properties of $Ni_3Sn_4$ compounds prepared by the above-described procedure, a lithium secondary battery was fabricated using metallic lithiums as a counter electrode and a reference electrode and using 1 M $LiPF_6$ dissolved in a mixed solvent of ethylene carbonate (EC) and diethylcarbonate (DEC) as an electrolyte solution. The cycle characteristics of the prepared lithium secondary battery were evaluated, and the result thereof is shown in FIG. 5. Here, the cycle characteristics were evaluated by performing charging and discharging at a constant current density of 0.2 $mA/cm^2$ within the range of measured potential of 0 to 1.2 V.

Referring to FIG. 5, as the $Ni_3Sn_4$ crystalinity became better, the charging/discharging capacity was reduced, leading to remarkable improvement of cycle characteristics. Also, the charging/discharging capacity of $Ni_3Sn_4$ powder was proportionate to a volume fraction of the grain boundary of the powder depending on thermal treatment performed after milling. $Ni_3Sn_4$ having good crystalinity did not exhibit a decrease in capacity even during lithium intercalation/deintercalation, from which lithium is presumably intercalated/deintercalated into/from the grain boundary of $Ni_3Sn_4$. Here, grains of $Ni_3Sn_4$ that is inactive against lithium act as hosts of lithium intercalation/deintercalation, which suppress volume swelling, thereby maintaining good cycle characteristics.

Figure 6:
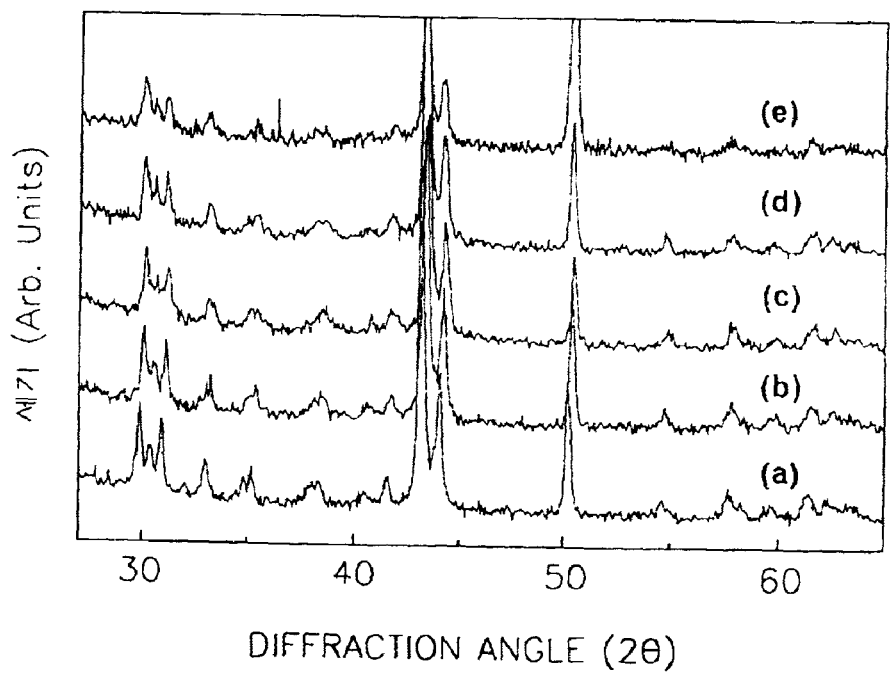
FIG. 6 represents an X-ray diffraction analysis of $Ni_3Sn_4$ at (a) initial state, (b) 0.25 V charging state, (c) 0.05 V charging state, (d) 1.2 V discharging state, and (e) after 100 cycles, in the lithium secondary battery employing $Ni_3Sn_4$ prepared by Example 1 of the present invention.

FIG. 6 represents an X-ray diffraction analysis based on charging/discharging steps applied to $Ni_3Sn_4$ powder prepared by milling tin and nickel powder for approximately 10 hours and thermally treating the same at 500° C. for approximately 1 hour, showing the electrochemical change of lithium during intercalation/deintercalation into/from $Ni_3Sn_4$ powder.

Referring to FIG. 6, a 0.25 V charging step (b) and a 0.05 V charging step (c) were performed at an initial state (a), lithium intercalation was performed, and then a 1.2 V discharging step (d) was performed, followed by lithium deintercalation. The $Ni_3Sn_4$ crystalinity was still maintained. Even after 100 cycles of these steps (e), no change in the diffraction pattern was observed.

In known tin-based intermetallic compounds that have been reported so far, a phase change occurs during lithium intercalation, so that a counter metal relative to tin (Sn) is separated by diffusion of lithium ions, and the lithium ions react with tin (Sn) to form a lithium-tin (Li—Sn) alloy phase. The tin and counter metal formed by the reaction are very small grains and are uniformly distributed, exhibiting improved cycle characteristics relative to tin and the counter metal of tin. However, the tin-based intermetallic compound undergoes aggregation of tin due to repetition of intercalation and deintercalation of lithium ions, causing severe mechanical damage of active materials due to a change in volume, like in metallic tin, thereby degrading cycle characteristics.

On the other hand, in the $Ni_3Sn_4$ structure of the present invention as shown in FIG. 6, a peak corresponding to tin (Sn) is not observed even during intercalation of lithium, which means that no phase change occurs, unlike in the conventional tin-based intermetallic compounds, but the $Ni_3Sn_4$ crystallinity is maintained, thereby greatly improving cycle characteristics.

The $Ni_3Sn_4$ intermetallic compound, as shown in FIG. 5, has a capacity per weight of approximately 100 mAh/g, which is not suitable to be employed as an anode active material of a bulk-type battery. However, since the $Ni_3Sn_4$ intermetallic compound has a large density, i.e., 8.42 g/cm$^3$, it can be suitably used as an anode active material in view of good cycle characteristics for a thin film battery in which a capacity per volume is quite an important factor. Also, since there is little change in lattice constant due to lithium intercalation/deintercalation, it is presumed that a change in volume is not so big during lithium intercalation, which means that the $Ni_3Sn_4$ intermetallic compound can be suitably used as the anode material of a thin film battery necessitating high mechanical stability between an electrode and an electrolyte and between an electrode and a current collector.

EXAMPLE 2

A $Ni_3Sn_4$ thin film was deposited by e-beam evaporation and ion beam assisted deposition (IBAD) using the $Ni_3Sn_4$ powder prepared in Example 1 as an evaporation source.

Figure 7:
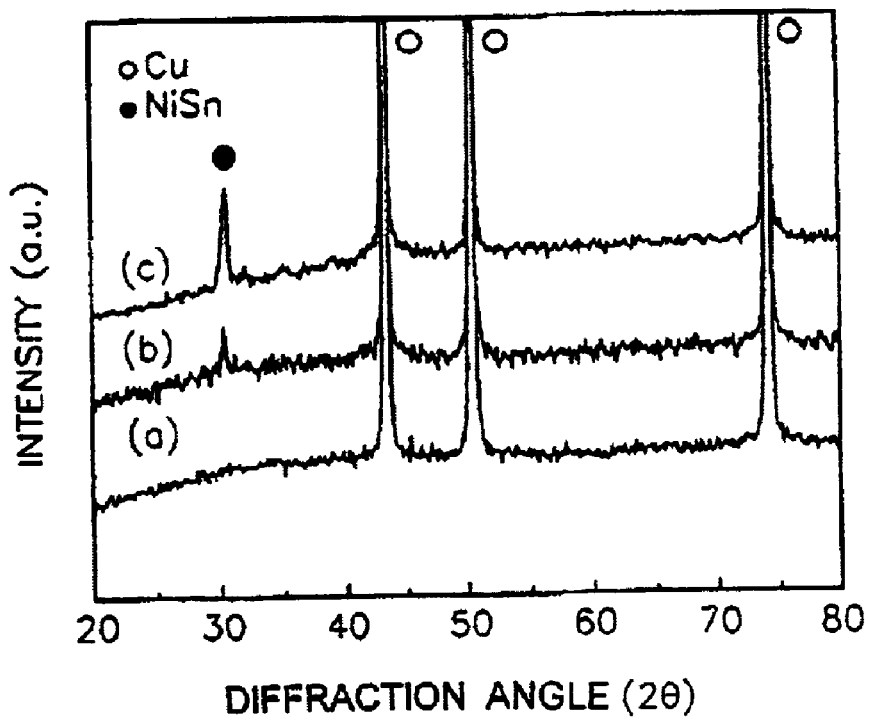
FIG. 7 represents an X-ray diffraction analysis of a $Ni_3Sn_4$ anode thin film prepared by Example 2 of the present invention.

FIG. 7 shows X-ray diffraction analysis results of a thin film deposited using to the e-beam evaporation and IBAD. Evacuation was performed from an initial vacuum state to $2 \times 10^{-6}$ torr and argon gas was induced to maintain an operating pressure of $2 \times 10^{-5}$ torr. An e-beam acceleration voltage of 5.7 kV and an e-beam current of 20 mA were applied to the $Ni_3Sn_4$ powder prepared in the above-described manner for 10 minutes and 20 minutes, respectively for deposition of thin films having thicknesses of 640 Å (FIG. 7A) and 920 Å (FIG. 7B). Under these conditions, the $Ni_3Sn_4$ powder was deposited with an argon ion acceleration voltage of 100 keV and an ion beam current of 20 mA to prepare a thin film having a thickness of 1500 Å.

Referring to FIG. 7, when the time of deposition by e-beam evaporation is increased or ion beams are irradiated onto a substrate, a diffraction peak is observed around a diffraction angle of 30°, which is presumably derived from NiSn which is a metastable phase.

Figure 8:
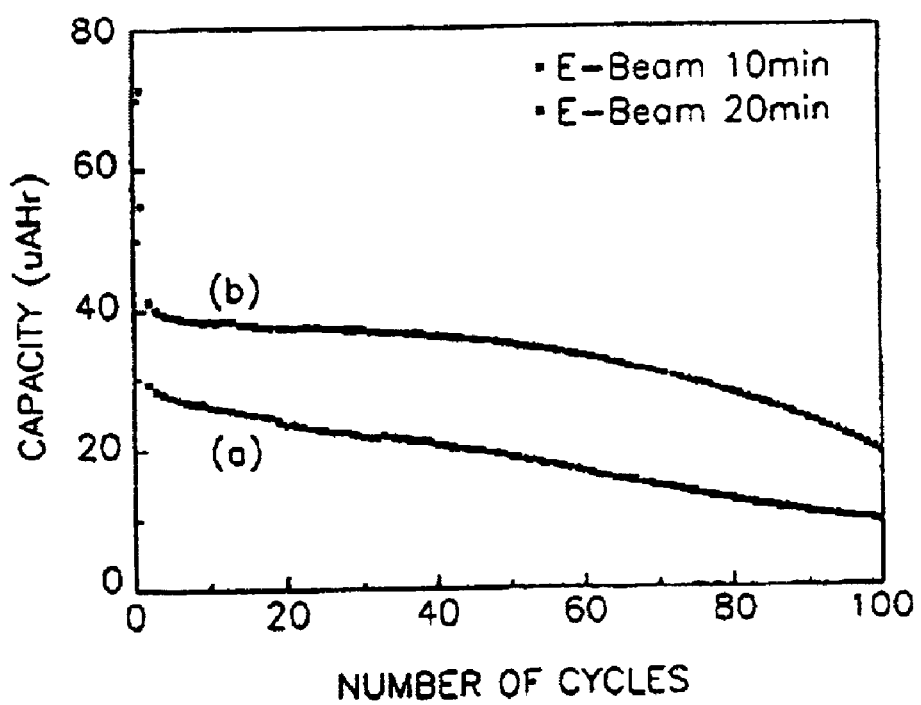
FIG. 8 represents charging/discharging cycle characteristics of a lithium secondary battery employing the $Ni_3Sn_4$ anode thin film prepared by Example 2 of the present invention.

FIG. 8 shows charging/discharging cycle characteristics of the $Ni_3Sn_4$ anode film prepared by the above-described process.

Referring to FIG. 8, the plot (a) is for the case of irradiating e-beam for 10 minutes and the plot (b) is for the case of irradiating e-beam for 20 minutes. In the case indicated by the plot (b), the crystallinity and cycle characteristic are better than in the case indicated by the plot (a). However, the cycle characteristic of the $Ni_3Sn_4$ anode film is still poorer than that of the $Ni_3Sn_4$ powder having good crystallinity. These results show that use of the $Ni_3Sn_4$ powder, in which nickel (Ni) and tin (Sn) are stoichiometrically bonded, as an evaporation source, makes it difficult to control the composition of the deposited thin film.

On the other hand, as shown in FIG. 7(c), deposition using IBAD can appropriately controls conditions of accelerated ion beam irradiation to increase the mobility and reactivity of atoms while colliding the atoms deposited on the target, thereby preparing a crystalline $Ni_3Sn_4$ thin film even at room temperature.

As described above, in the case of using $Ni_3Sn_4$ powder, in which nickel (Ni) and tin (Sn) are stoichiometrically bonded, as an evaporation source, vapor pressures and volatility degrees of nickel and tin are different, which makes it quite difficult to attain a thin film having the same composition as that of the evaporation source. To solve this problem, there has been made an attempt to facilitate control of the compositions of tin and nickel by co-fusing e-beams using tin and nickel as evaporation sources, respectively. Here, accelerated argon (Ar) ions are irradiated onto a substrate simultaneously with the Sn and Ni evaporation sources, thereby increasing the mobility of deposited atoms or changing the surface state of the thin film. The composition of the thin film can be varied by adjusting the flux of e-beam. The crystallinity and fine structure of the deposited thin film can be adjusted by varying the flux and acceleration voltage of Ar ions.

Figure 9:
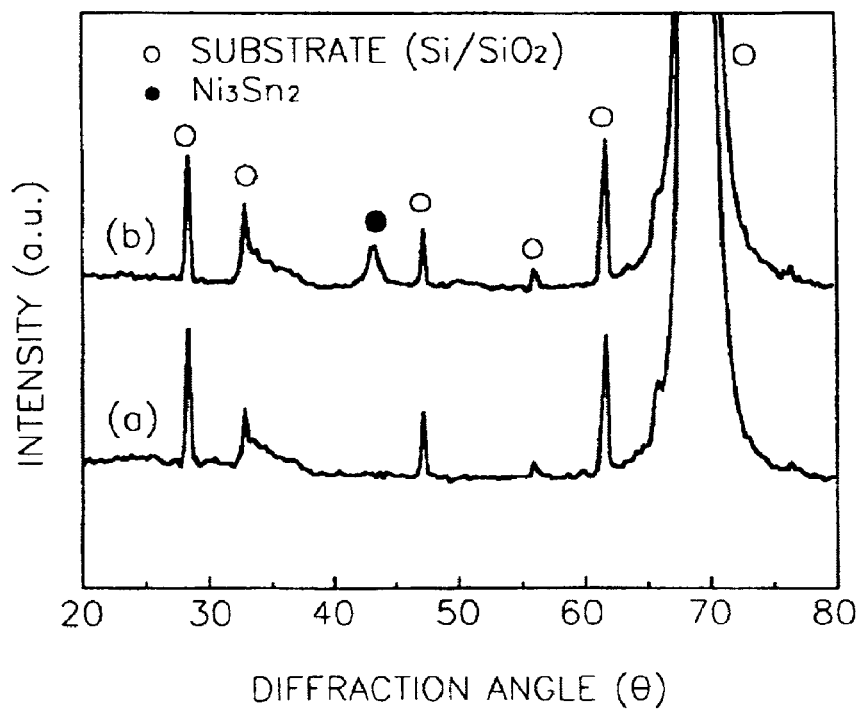
FIG. 9 represents an X-ray diffraction analysis of the $Ni_3Sn_4$ anode thin film prepared by Example 2 of the present invention.

First, an initial vacuum state is turned into an evacuated state up to $2 \times 10^{-6}$ torr and argon gas was induced to maintain an operating pressure of $2 \times 10^{-5}$ torr. Thereafter, under the condition of an e-beam acceleration voltage of 5.7 kV, e-beam currents of 110 mA and 75 mA were applied to tin and nickel, respectively, for deposition of a thin film having a thickness of 950 Å. FIG. 9(b) shows the X-ray diffraction analysis result for the thus-prepared thin film, whereas FIG. 9(a) shows the X-ray diffraction analysis result for a $Si/SiO_2$ substrate. As shown in FIG. 9(b), a diffraction peak is observed around a diffraction angle of 28°, from which the thin film is determined as a $Ni_3Sn_2$ thin film.

Figure 10:
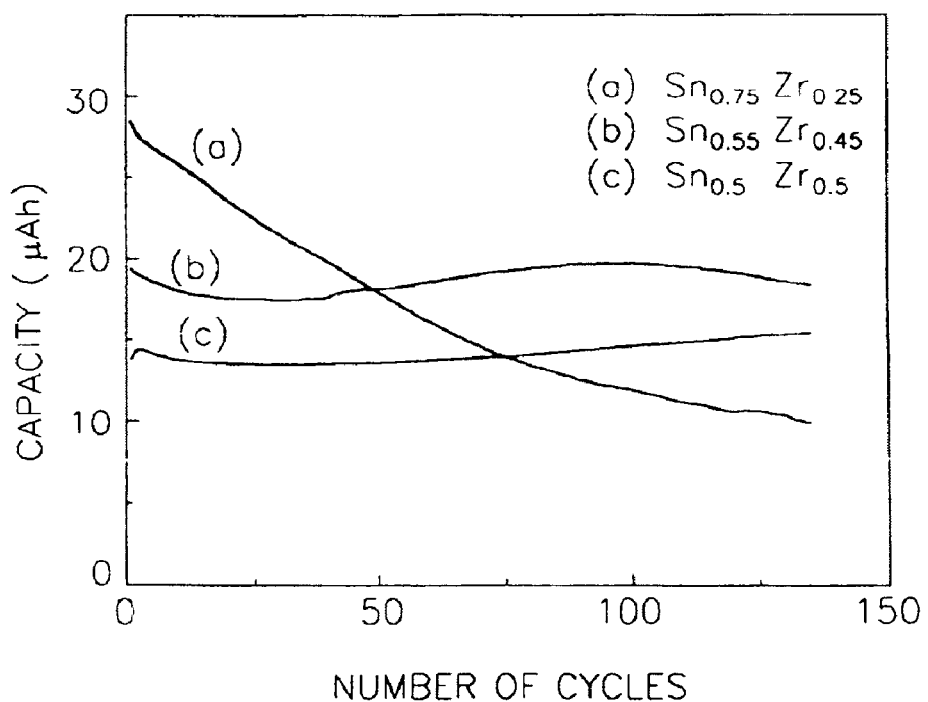
FIG. 10 represents charging/discharging cycle characteristics of the $Ni_3Sn_4$ anode thin film prepared by Example 2 of the present invention.

FIG. 10 represents charging/discharging cycle characteristics of the $Ni_3Sn_2$ anode thin film prepared by the above-described process. Here, the cycle characteristics were evaluated by performing charging and discharging on lithium at a constant current of 30 μA/cm$^2$ within the range of measured potential of 0 to 1.2 V.

As shown in FIG. 10, the capacities of the $Ni_3Sn_2$ anode thin film are maintained at lower levels, which is because it has a very low electrochemically activity.

However, as described above, the $Ni_3Sn_4$ thin film can be deposited even at room temperature by varying the composition, crystallinity and fine structure of the thin film such that the flux of e-beams and the flux and acceleration voltage of Ar ions are varied.

The cycle characteristics of the anode thin film according to the present invention can be remarkably improved by suppressing dilation and shrinkage of tin during charging/discharging steps. Therefore, use of the anode thin film according to the present invention can greatly improve the chemical, mechanical stability of the interface between an electrode and an electrolyte, thereby preparing a lithium secondary battery having improved life characteristics.

What is claimed is:

1. An anode thin film for a lithium secondary battery having a current collector and an anode active material layer formed thereon, wherein the anode active material layer contains an intermetallic compound of tin (Sn) and nickel (Ni) heat treated in the range of 300° C. to 550° C.

2. The anode thin film of claim 1, wherein the intermetallic compound is $Ni_3Sn_4$.

3. A method of preparing an anode thin film of claim 1 by co-sputtering tin (Sn) and metallic nickel (Ni).

4. The method of claim 3, wherein the intermetallic compound is $Ni_3Sn_4$.

5. A method of preparing an anode thin film of claim 1 by forming an intermetallic compound evaporation source of tin (Sn) and metallic nickel (Ni) by a mechanical alloying method and depositing the intermetallic compound evaporation source by at least selected from the group consisting of e-beam evaporation and ion beam assisted deposition (IBAD) and heat treating the intermetallic compound in the range of 300° C. to 550° C.

6. The method of claim 5, wherein the intermetallic compound is $Ni_3Sn_4$.

7. A lithium secondary battery employing an anode thin film having a current collector and an anode active material layer formed thereon, wherein the anode active material layer contains an intermetallic compound of tin (Sn) and nickel (Ni) heat treated in the range of 300° C. to 550° C.

8. The lithium secondary battery of claim 7, wherein the intermetallic compound is $Ni_3Sn_4$.

9. The lithium secondary battery of claim 7, wherein the battery is a thin film battery.

* * * * *